United States Patent [19]
Strum

[11] Patent Number: 5,986,217
[45] Date of Patent: Nov. 16, 1999

[54] PRINTED CIRCUIT BOARD FOR MITIGATING THERMALLY-INDUCED MECHANICAL DAMAGE OF SOLDER JOINTS CONNECTING ELECTRONIC COMPONENTS

[75] Inventor: Michael J. Strum, San Jose, Calif.

[73] Assignee: Hewlett-Packard Company, Palo Alto, Calif.

[21] Appl. No.: 08/956,166

[22] Filed: Oct. 22, 1997

[51] Int. Cl.$^6$ ........................................ H05K 1/00
[52] U.S. Cl. .................. 174/260; 174/254; 361/749
[58] Field of Search ................... 174/254, 260; 361/749, 750, 751, 788, 792

[56] References Cited

U.S. PATENT DOCUMENTS

| | | | |
|---|---|---|---|
| 4,554,575 | 11/1985 | Lucas | 357/80 |
| 4,641,222 | 2/1987 | Derfiny et al. | 361/403 |
| 4,654,248 | 3/1987 | Mohammed | 428/137 |
| 4,658,332 | 4/1987 | Baker et al. | 361/398 |
| 4,847,136 | 7/1989 | Lo | 428/195 |
| 4,853,491 | 8/1989 | Butt | 174/52.4 |
| 4,876,120 | 10/1989 | Belke et al. | 428/1 |
| 5,248,853 | 9/1993 | Ishikawa et al. | 174/256 |
| 5,369,551 | 11/1994 | Gore et al. | 361/767 |
| 5,641,946 | 6/1997 | Shim | 174/261 |
| 5,768,108 | 6/1998 | Miura et al. | 361/792 |

*Primary Examiner*—Hyung-Sub Sough
*Assistant Examiner*—William Silverio
*Attorney, Agent, or Firm*—Marc R. Mayer

[57] ABSTRACT

A printed circuit board for minimizing thermally-induced mechanical damage of solder joints electrically connecting electronic components to the printed circuit board. The printed circuit board includes a first substrate, solder pads, and an expansion layer. The first substrate has two substantially parallel major surfaces, and a first coefficient of thermal expansion (CTE). The solder pads are located on one of the major surfaces of the substrate. The expansion layer has a second CTE, different than the first CTE, and is affixed to a portion of one of the major surfaces. The expansion layer is also arranged to provide a predetermined degree of bending for a given temperature change to a portion of the first substrate proximate to the expansion layer and to two of the solder pads, thus forming a concavity in the portion of the substrate.

19 Claims, 6 Drawing Sheets

PRINTED CIRCUIT BOARD FOR MITIGATING THERMALLY-INDUCED MECHANICAL DAMAGE OF SOLDER JOINTS CONNECTING ELECTRONIC COMPONENTS

BACKGROUND OF THE INVENTION

1. Field of the Invention

The present invention relates generally to printed circuit boards and more particularly to reducing thermally-induced mechanical damage of solder joints that connect electronic components to printed circuit boards.

2. Description of the Related Art

Thermally-induced mechanical damage of solder joints connecting electronic components to printed circuit boards (PCBs) has been a long-standing problem. The thermally-induced mechanical damage of solder joints is caused primarily by the different rate of expansion of a PCB and components connected to the PCB with temperature change. Virtually all substances expand when heated and contract when cooled. The magnitude of these changes in size for a particular material are described by a coefficient of thermal expansion (CTE) for that material. The larger the coefficient of thermal expansion, the greater the change in size for a given temperature change.

Figure 1A:
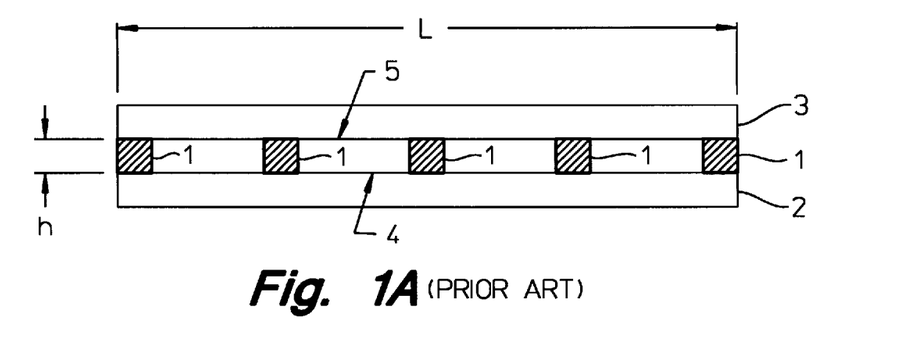
FIG. 1A is a side view of a printed circuit assembly according to the prior art.
Figure 1B:
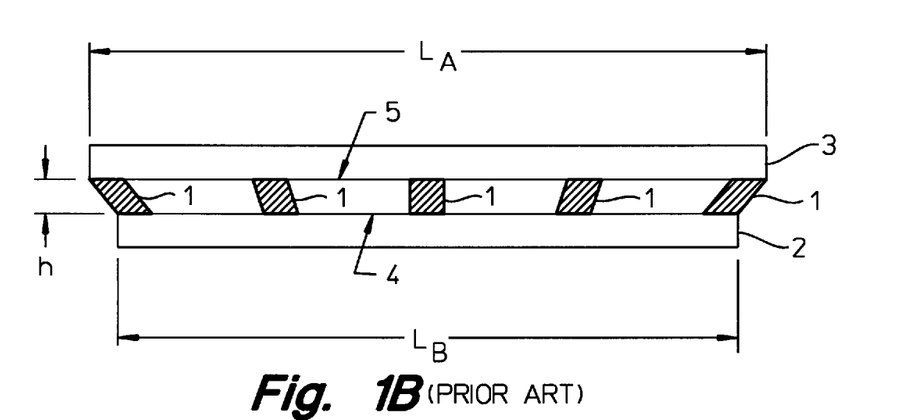
FIG. 1B is the same view as in FIG. 1A, after a change in temperature.

A PCB will typically have a CTE greater than that of connected electronic components. This is because most electronic components include silicon, and silicon has a relatively low CTE. When a component and a PCB are electrically connected using solder joints, these joints are subjected to stress during temperature change because the component and the PCB move relative to one another. This movement must be absorbed by the solderjoints. This phenomenon is depicted in FIG. 1A and 1B. FIG. 1A shows an electronic component 2, a PCB 3, and solder joints 1. The electronic component is arranged parallel to the PCB and is both separated from and connected to the PCB by solder joints 1. The solder joints are unstressed and are aligned perpendicular to both the PCB and the electronic component. FIG. 1B depicts the same component 2, PCB 3 and solder joints 1 after a temperature change. Both the PCB and the electronic component show thermal expansion, but the PCB has expanded to a greater extent than has the electronic component. As a result, some of the solder joints 1 are stressed and no longer are perpendicular to the PCB and the electronic component.

Figure 2:
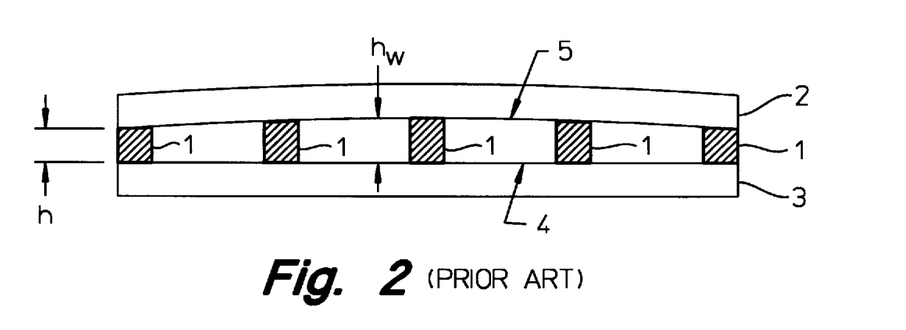
FIG. 2 is the same view as in FIG. 1A, showing electronic component warpage due to temperature change.

A second type of thermally-induced mechanical damage of solderjoints is due to warpage of electronic components caused by variations in the CTE of different materials which constitute the electronic component. During a temperature change, the magnitude of the warpage of the electronic component changes, which, in turn, varies the distance between portions of the electronic component and original plane of the printed circuit board. This change in distance subjects the solder joints connecting the electronic component to the rigid PCB to stress, i.e., tensile stress or compressive stress. This warping phenomenon is depicted in FIG. 2. FIG. 2 shows an electronic component 2, a PCB 3, and solder joints 1. The electronic component is warped, but is nevertheless arranged substantially parallel to the PCB. The electronic component is also both separated from and connected to the PCB by solder joints 1. The warpage of the electronic component causes the distance between the electronic component and the PCB to vary from a minimum distance h near an edge of the electronic component to a maximum distance $h_w$ near the center of the electronic component. Both the minimum distance and maximum distance may vary with temperature change, and, as a result, some of the solder joints 1 must conform to these variations and are subjected to stress.

Both these types of thermally-induced stress on a solder joint decrease the mean time between failures for the joint and can result in a complete failure of a PCB assembly. Hence, reducing thermally-induced stress is a key factor in mitigating thermally-induced mechanical damage of solder-joints connecting electronic components to PCBs and therefore improves the quality and reliability of the solder joints.

The problem of thermally-induced mechanical damage of solder joints has become more pronounced as the number of solder joints connecting an individual electronic component to a PCB have continued to increase. Larger numbers of solder joints for an individual electronic component have forced solder joints to become smaller and more densely packed into a given area of a PCB, while at the same time, the dimensions of the electronic components have increased to accommodate all the necessary solder connections. Additionally, the heat generated by the more complex components has become increasingly large. The combination of additional heat and larger component dimensions further aggravate the problem because small localized displacements accumulate over the entire component and result in larger net displacements.

In response to the problem of thermally-induced mechanical damage of solder joints, the PCB industry has tried numerous solutions, none of which has proved completely satisfactory. First, PCBs have been reinforced with cross-woven glass fibers. This has reduced the coefficient of thermal expansivity of the reinforced PCB when compared to an unreinforced PCB, but even the reinforced PCB has a higher coefficient of thermal expansivity than a typical electronic component. Second, various methods of cooling the heat generating components, including passive methods such as heat sinks and active methods such as cooling fans, have been tried. These methods are not practical in many applications due to cost and size factors. Lastly, some have tried to solve the thermally-induced stress problem by inserting a stress relief interface system, such as is described in U.S. Pat. No. 5,369,551, between the electronic component and the PCB. Such systems are not practical in many applications due to cost and size constraints.

From the foregoing it will be apparent that there is a need for a low cost, small and effective apparatus for mitigating thermally-induced mechanical damage of solder joints in order to increase the mean time between failures for the solder joints and improve reliability of PCB assemblies.

SUMMARY OF THE INVENTION

The present invention provides a printed circuit board for minimizing thermally-induced mechanical damage of solderjoints electrically connecting electronic components to the printed circuit board by utilizing the normally destructive thermal expansion forces to bend the printed circuit board to minimize the stress on the solder joints. The invention provides a low cost, easily implemented, and versatile solution to the long-standing problems associated with damage to solder joints caused by thermally-induced stresses. The improved reliability provided by the invention can remove constraints on power consumption and thermal cycles currently placed on electronic components. In addition, the need to underfill or encapsulate unreliable electronic components could be eliminated by the invention.

Briefly and in general terms, one embodiment of the printed circuit board for mitigating thermal mechanical damage of solder joints according to the invention includes a first substrate, solder pads, and an expansion layer. The solder pads are located on one side of the substrate. The expansion layer is affixed to a portion of one side of the substrate, and the expansion layer has a coefficient of thermal expansion (CTE) different than the CTE of the substrate. The expansion layer is arranged to provide a predetermined degree of bending for a given temperature change to a portion of the first substrate proximate to the expansion layer and to two of the solder pads, thus forming a concavity in the portion of the substrate.

The invention may also include an electronic component electrically connected to the printed circuit board using solder joints. In this case, the invention includes a flexible printed circuit board (PCB), a thermally expansive layer, and an electronic component which together mitigate thermal mechanical damage of solder joints connecting the PCB and the electronic component. The flexible PCB has two sides and a first CTE. The thermally expansive layer has a second CTE which is different than the first CTE. The thermally expansive layer is affixed to a portion of one side of the flexible PCB such that the difference between the first CTE and the second CTE causes bending of the flexible PCB as temperature changes. The electronic component has yet a third CTE, different from both the first CTE and the second CTE, and is mounted in electrical contact with one side of the flexible PCB by solder joints.

DESCRIPTION OF THE PREFERRED EMBODIMENT

In the following detailed description and in the several figures of the drawings, like elements are identified with like reference numerals. As shown in the drawings for purposes of illustration, the invention provides a printed circuit board (PCB) for mitigating the thermally-induced mechanical damage of solder joints connecting a electronic component to the PCB by bending with temperature change. The invention is based on the concept that conformal bending of both the electronic component and the substrate of a printed circuit assembly can accommodate the displacements caused by a thermal expansivity mismatch. Conformal bending causes a non damaging rotational movement of the solder joints connecting the electronic component to the PCB instead of the damaging linear movement, e.g., shear.

Conformal bending also eliminates distance changes between the electronic component and the PCB which are caused by warpage of the electronic component during temperature changes. This, in turn, eliminates the stress, e.g., tensile strain, these changes in distance normally place on solder joints connecting the electronic component to the PCB.

The invention utilizes the curvature induced within a bi-material or multi-material plate with unequal coefficients of thermal expansion (CTE) to produce conformal bending of the electronic component and the substrate of the PCB during a thermal cycle. In the invention, a tailored PCB is used that produces a thermal bend radius which conforms to that of the electronic component.

Thermally-induced curvature of some existing electronic components, such as plastic ball-grid arrays (PBGAs), occur naturally in the proper direction due to the higher net CTE at the bottom of the package (mostly high expansivity polymeric materials) relative to the top (mostly low expansivity silicon). To achieve an appropriately matching curvature of the PCB, a uniform or discretely placed layer of thermally expansive material may be added to one surface of the substrate to produce the desired thermal bend radius. If it is desirable to modify the naturally occurring bend radius of an electronic component for a particular application, a similar layer may also be added to one surface of the electronic component to help produce the desired thermal bend radius.

The high thermal expansivity of unreinforced epoxy and other materials, discussed below, can be used to induce the proper direction of curvature in the substrate of the PCB and the electronic component. Because the curvature required for rotation of the solderjoints to accommodate thermal mismatch strains and the curvature produced by the elastic response of a bi-material strip are both proportional to the magnitude of the temperature change, the requirements for rotation of the solder joints are made independent of temperature change.

A number of different methods can be used to implement the invention by tailoring the distribution of the package and the PCB materials and their thermal expansivities. It should be noted that any modification to existing assemblies which produce a closer match to the ideal thermal bending conditions defined below will reduce the solder damage caused by thermal cycling.

FIG. 1A depicts an electronic component 2, a PCB 3, and solder joints 1 connected without bending as is known in the prior art. The electronic component has one CTE and the PCB has a second, different PCB. The electronic component and is arranged parallel to the PCB and is both separated from and connected to the PCB by solder joints 1. The solder joints are unstressed are aligned perpendicular to both the PCB and the electronic component. The solderjoints have a height h and are all connected within a portion of the PCB 3 having length L. Similarly, the solder joints are all connected within a portion of the electronic component having the same length L.

FIG. 1B depicts the same component 2, PCB 3 and solder joints 1 after a temperature change. Both the PCB and the electronic component show thermal expansion, but the PCB has expanded to a greater extent than has the electronic component. As a result, some of the solder joints 1 are stressed and no longer are aligned perpendicular to the PCB and the electronic component. The length of the electronic component is now $L_B$ and the length of the PCB is now $L_A$. Since the electronic component 2 and PCB 3 have different CTEs, there is a net displacement of the electronic component 2 with respect to the PCB 3. The net displacement ($\Delta L$) is proportional to the difference between the CTE of the electronic component and the PCB ($\Delta \alpha$), the magnitude of the temperature change ($\Delta T$), and the distance from the center of the expanding portion of the electronic component and the PCB (L/2). This can be expresses as:

$$\Delta L = \frac{1}{2} L (\Delta \alpha)(\Delta T) = (L_A - L_B)/2.$$

Thus, without bending, a temperature change causes a net displacement ($\Delta L$) between the point where the solder joint 1 connects to the electronic component 2 and the point where the solder joint connects to the PCB 3. This displacement produces strain ($\delta$) on the solder joint, defined as: $\delta = \Delta L / h$.

Figure 3:
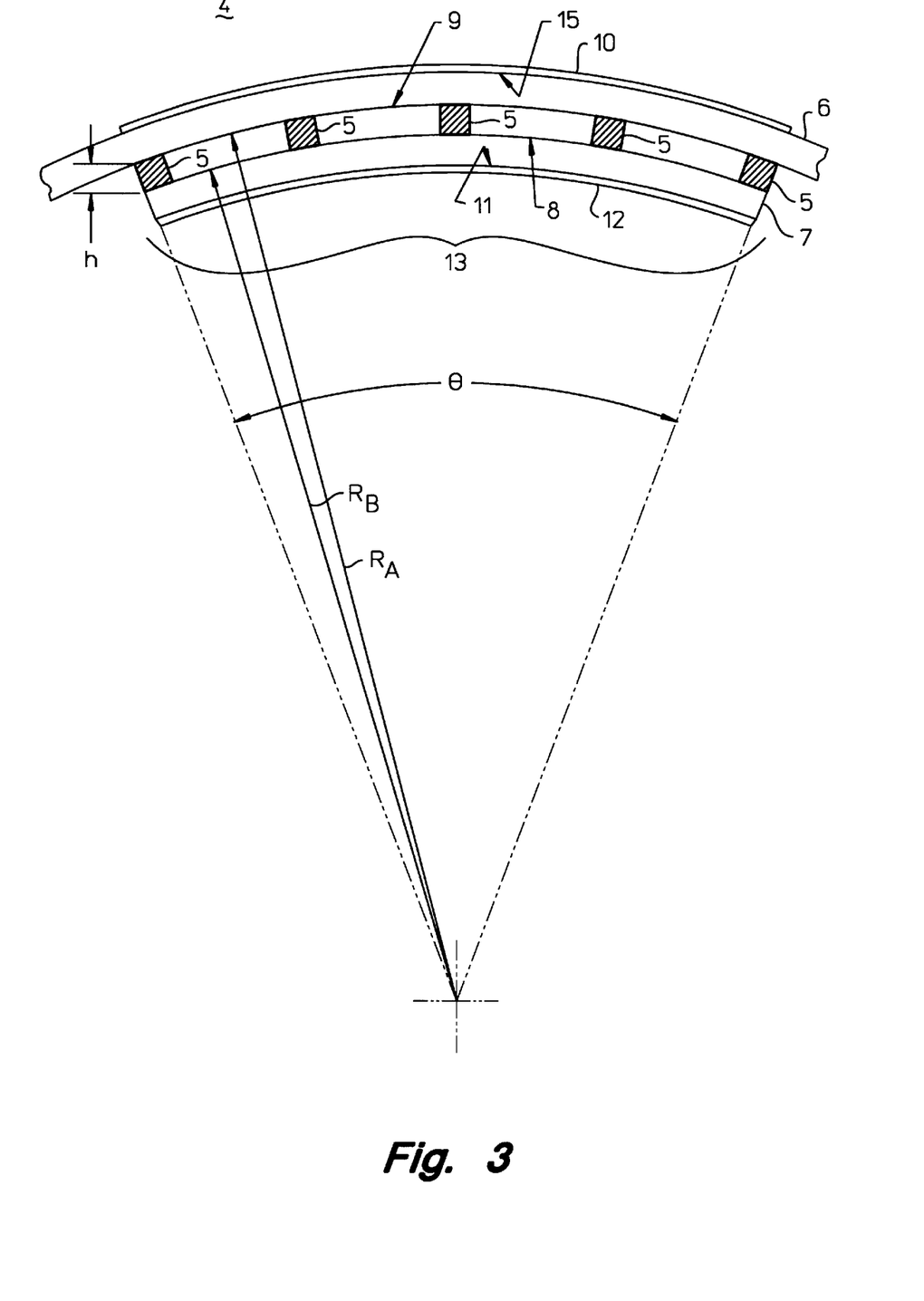
FIG. 3 is a cross sectional view of a first preferred embodiment of a printed circuit assembly according to the invention.

FIG. 3 shows one preferred embodiment of a printed circuit assembly 4 according to the invention in which the stress ($\delta$) on the solder joints 5 is eliminated by conformal bending. The printed circuit assembly 4 includes a flexible PCB 6, an electronic component 7, solder joints 5, and a thermally expansive layer 10. The flexible PCB 6 has two substantially parallel sides 9, 15 and a portion of the PCB is bent to form a curve such that one side 9 has radius $R_A$. The electronic component 7 also has two substantially parallel sides 8, 11 and is bent such that it is parallel to the bent portion of the PCB but separated from the PCB by the height h of the solder joints 5 which electrically connect and physically separate the PCB and the electronic component. The surface 8 of the electronic component closest to the PCB has radius $R_B$. The thermally expansive layer 10 is affixed to the side 15 of the PCB opposed to the electronic component.

In this embodiment, the stress ($\delta$) on the solder joints 5 is eliminated when the bend radius $R_B$ of the electronic component 7 and the bend radius $R_A$ of the PCB 6 continue over equal subtended angles ($\theta$). Where the subtended angle for both the PCB 6 and electronic component 7 are equal, there is no net displacement between the point where the solder joint connects to the electronic component surface 8 and the point where the solder joint connects to the PCB surface 9.

In addition, the bend radius of the PCB, $R_A$, and the bend radius of the electronic component, $R_B$, should be set such that the difference between the two radii is equal to the height of the solder joints h. If this difference is maintained there will be no net tensile displacement at the solder joints.

Thus, the necessary bend radius of the PCB, $R_A$, to eliminate stress and tensile displacement on the solder joint is determined by:

$$R_A = R_B + h = (h/(\Delta \alpha)(\Delta T)) + h$$

Examples of the bend radius required to eliminate stress are tabulated below:

| Package Diagonal (L) inch | Differential coefficients of thermal expansion ($\Delta \alpha$) inch/° C. | Temperature Change ($\Delta T$) ° C. | Solder Height (h) inch | PCB Radius ($R_A$) inch |
|---|---|---|---|---|
| 0.5 | $8 \times 10^{-6}$ | 50 | 0.03 | 75 |
| 0.5 | $8 \times 10^{-6}$ | 50 | 0.02 | 50 |
| 0.5 | $8 \times 10^{-6}$ | 50 | 0.01 | 25 |
| 0.5 | $8 \times 10^{-6}$ | 50 | 0.005 | 12.5 |

To achieve the calculated radius of the PCB 6, $R_A$, in practice, a thermally expansive layer 10 having a CTE different than the CTE of the PCB is affixed to a portion of the PCB 6 such that a difference between the CTE of the expansive layer and the CTE of the PCB causes the PCB to bend as temperature changes.

Achieving the calculated radius of the electronic component, $R_B$, in practice can be done in a number of ways. For example, the natural bending caused by the bi-material design of many electronic components can be utilized. Many electronic components are made of thin silicon encapsulated in polymer, and often the thin silicon is not centered within the encapsulation, but instead is found near one of the two major surfaces 8, 11 of the electronic component. When the silicon is not centered, the difference between the CTE of the silicon and the CTE of the polymer results in a natural bend.

The magnitude of the natural bending of the electronic component 7 can also be altered to achieve a particular radius by affixing a second thermally expansive layer 12 to one of the major surfaces 8, 11 of the electronic component 7. The second thermally expansive layer, having a CTE different from the CTE of the electronic component, imposes a force on the electronic component causing the magnitude of the natural bend to be changed for a particular temperature change. Similarly, an electronic component 7 without a natural bend can be caused to bend as desired by affixing a second thermally expansive layer 12 to one of the major surfaces 8, 11 of the electronic component.

Alternatively, the electronic component 7 can be designed to be very thin and flexible. A thin and flexible electronic component would be forced to follow a bend in the PCB 6 due to the solder joints 5 connecting the electronic component to the PCB. Similarly, the PCB and electronic component can be affixed to one another using an adhesive, underfill, or other mechanical means which would force the thin and flexible electronic component to mimic the bending of the PCB without placing any significant stress on the solder joints.

Likewise, in some applications the PCB 6 can be designed to be very thin and flexible. A thin and flexible PCB would be forced to follow a bend in the electronic component 7 due to the solder joints 5 connecting the electronic component to the PCB. Alternatively, the PCB and electronic component can be affixed to one another using an adhesive, underfill, or other mechanical means which would force the thin and flexible PCB to mimic the bending of the PCB without placing any significant stress on the solder joints.

In the embodiment of the printed circuit assembly shown in FIG. 3, the CTE of the PCB 6 is greater than the CTE of the electronic component 7 but less than the CTE of the thermally expansive layer 10, so that an increase in temperature causes the PCB to form a concavity 13. The concavity has an opening facing away from the thermally expansive layer 10 and towards the electronic component 7. In this embodiment, it is preferred that the thermally expansive layer 10 includes an unreinforced high expansion polymer such as dicyandiamide (DICY) cured bifunctional epoxy, muntifunctional epoxy such as DriClad (DriClad is a registered trademark of IBM Corp), polyimide, polycarbonate, polyurethane, Slygard (Slygard is a registered trademark of Dow-Corning), or RTV.

Figure 4:
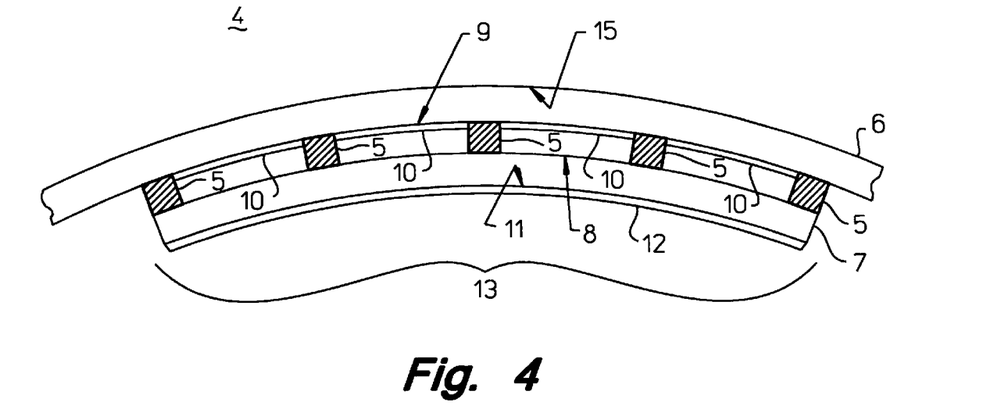
FIG. 4 is a cross sectional view of a second preferred embodiment of a printed circuit assembly according to the invention.

FIG. 4 depicts a second preferred embodiment of a printed circuit assembly 4 according to the invention in which the stress (δ) on the solder joints 5 is eliminated by conformal bending. The printed circuit assembly 4 includes a flexible PCB 6, an electronic component 7, solder joints 5, and a thermally expansive layer 10. The flexible PCB 6 has two substantially parallel sides 9, 15 and a portion of the PCB is bent to form a curve. The electronic component 7 also has two substantially parallel sides 8, 11 and is bent such that it is parallel to the bent portion of the PCB but separated from the PCB by the solder joints 5 which electrically connect and physically separate the PCB and the electronic component. The thermally expansive layer 10 is affixed to the side 9 of the PCB facing the electronic component.

This embodiment includes all the elements of the preferred embodiment depicted in FIG. 2, but in this embodiment the thermally expansive layer 10 is affixed to the same side 9 of the PCB 6 as the solderjoints 5 rather then the opposite side, 15. Additionally, in this embodiment, the CTE of the thermally expansive layer 10 is lower than the CTE of the PCB 6 but greater than the CTE of the electronic component 7. Thus the concavity 13 formed with temperature change opens facing towards the thermally expansive layer 10 and towards the electronic component 7.

Figure 5:
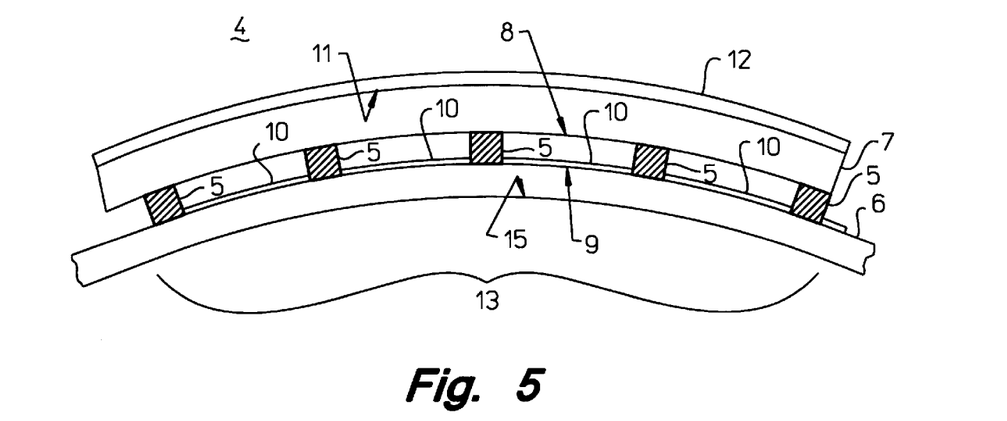
FIG. 5 is a cross sectional view of a third preferred embodiment of a printed circuit assembly according to the invention.

FIG. 5 depicts a third preferred embodiment of a printed circuit assembly 4 according to the invention in which the stress (δ) on the solder joints 5 is eliminated by conformal bending. The printed circuit assembly 4 includes a flexible PCB 6, an electronic component 7, solder joints 5, and a thermally expansive layer 10. The flexible PCB 6 has two substantially parallel sides 9, 15 and a portion of the PCB is bent to form a curve. The electronic component 7 also has two substantially parallel sides 8, 11 and is bent such that it is parallel to the bent portion of the PCB but separated from the PCB by the solder joints 5 which electrically connect and physically separate the PCB and the electronic component. The thermally expansive layer 10 is affixed to the side 9 of the PCB facing the electronic component.

This third embodiment includes all the elements of the preferred embodiment depicted in FIG. 4, however, the CTE of the thermally expansive layer 10 is greater than the CTE of the PCB 6, but lower than the CTE of the electronic component 7. Thus, the concavity 13 formed with temperature change opens facing away from the thermally expansive layer 10 and away from the electronic component 7.

Figure 6:
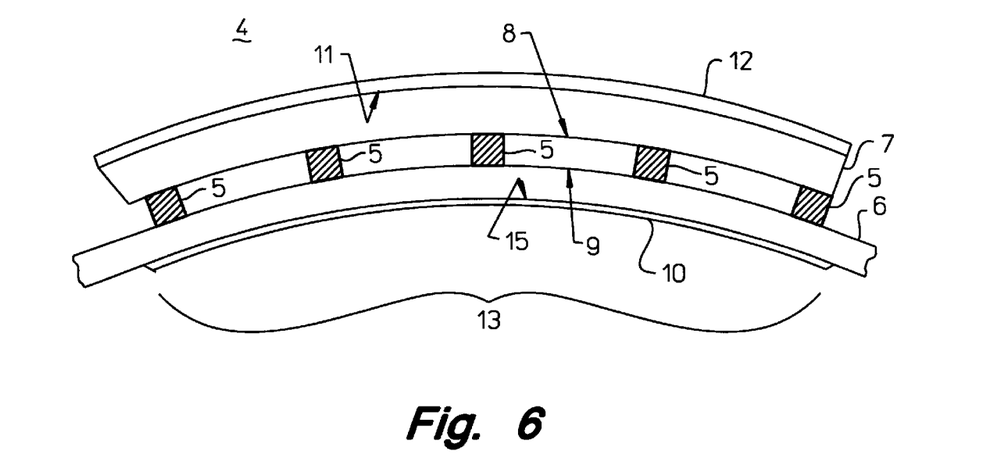
FIG. 6 is a cross sectional view of a fourth preferred embodiment of a printed circuit assembly according to the invention.

FIG. 6 depicts a fourth preferred embodiment of a printed circuit assembly 4 according to the invention in which the stress (δ) on the solder joints 5 is eliminated by conformal bending. The printed circuit assembly 4 includes a flexible PCB 6, an electronic component 7, solder joints 5, and a thermally expansive layer 10. The flexible PCB 6 has two substantially parallel sides 9, 15 and a portion of the PCB is bent to form a curve. The electronic component 7 also has two substantially parallel sides 8, 11 and is bent such that it is parallel to the bent portion of the PCB but separated from the PCB by the solderjoints 5 which electrically connect and physically separate the PCB and the electronic component. The thermally expansive layer 10 is affixed to the side 15 of the PCB opposed to the electronic component.

This embodiment includes all the elements of the preferred embodiment depicted in FIG. 3, however, the CTE of the PCB 6 is greater than the CTE of the thermally expansive layer 10, but lower than the CTE of the electronic component 7. Thus, the concavity 13 formed with temperature change opens facing toward the thermally expansive layer 10, but away from the electronic component 7.

In each of the preferred embodiments of the printed circuit assembly 4 according to the invention, the electronic component 7 may include a leaded component, a surface mount component, or an area array package such as a plastic ball grid array. In addition, each of the preferred embodiments, described above, may include a second thermally egpansive layer 12 affixed to the electronic component that aids the bending of the electronic component. Furthermore, the PCB 6, in each of the above described preferred embodiments may include any of the features and elements described below.

Figure 7A:
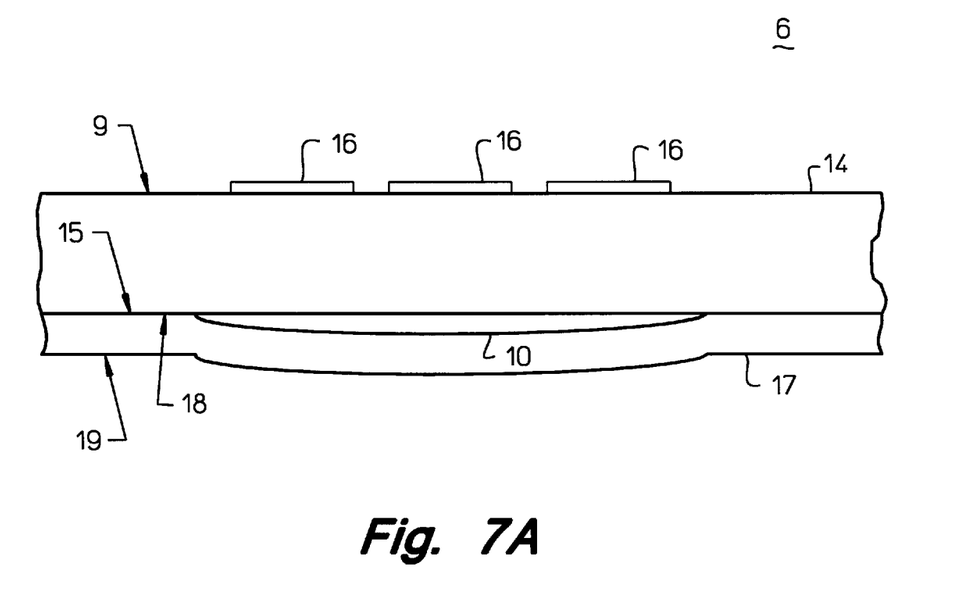
FIG. 7A is a cross sectional view of a printed circuit board according to the invention.

FIG. 7A depicts one preferred embodiment of the PCB 6 for mitigating thermal mechanical damage of solder joints electrically connecting an electronic component (not shown) to the PCB 6. The PCB includes a first substrate 14, solder pads 16, and expansion layer 10, and a second substrate 17. The substrate has two substantially parallel major surfaces 9, 15 and is normally made from a laminated material including conductive and non-conductive layers. The solder pads 16 are located on one of the major surfaces 9 with the expansion layer 10 affixed to the opposite major surface 15. A second substrate 17 having two substantially parallel primary surfaces 18, 19 may be used to cover the expansion layer. Thus, one of the primary surfaces 18 is affixed to the expansion layer, and may also be affixed to the same major surface 15 of the substrate to which the expansion layer is affixed.

Figure 7B:
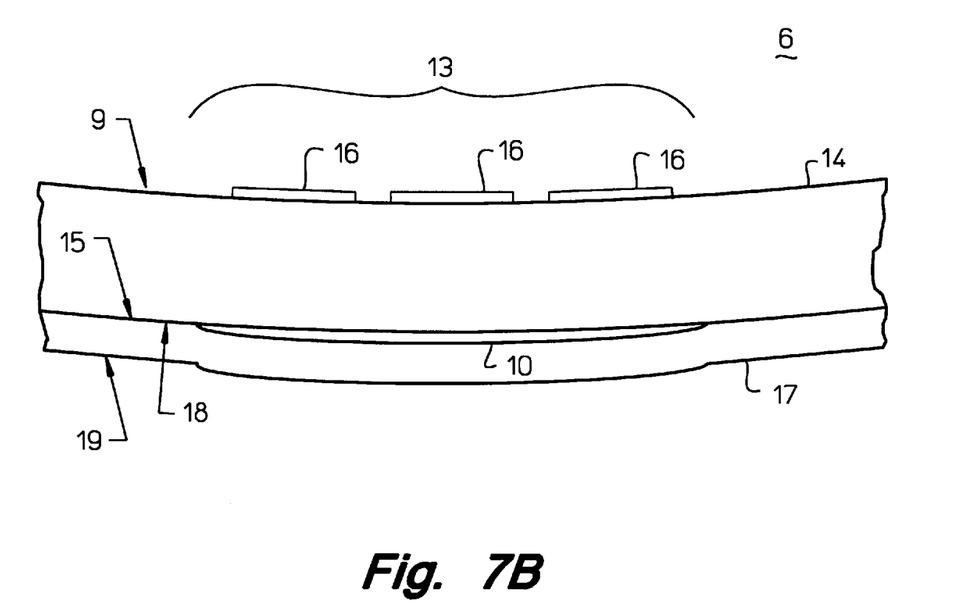
FIG. 7B is the same view as 7A, depicting a printed circuit board according to the invention after a change in temperature.

The expansion layer additionally has a CTE different than the CTE of the substrate and is arranged to provide a predetermined degree of bending for a given temperature change to a portion of the first substrate as can be seen in FIG. 7B. FIG. 7B depicts the same preferred embodiment as in FIG. 7A, with the portion of the substrate 14 shown in a bent position as would occur after a temperature change. The bent portion is proximate to the expansion layer 10 and proximate to two or more solder pads 16 such that a concavity 13 is formed in the portion of the substrate.

Figure 8A:
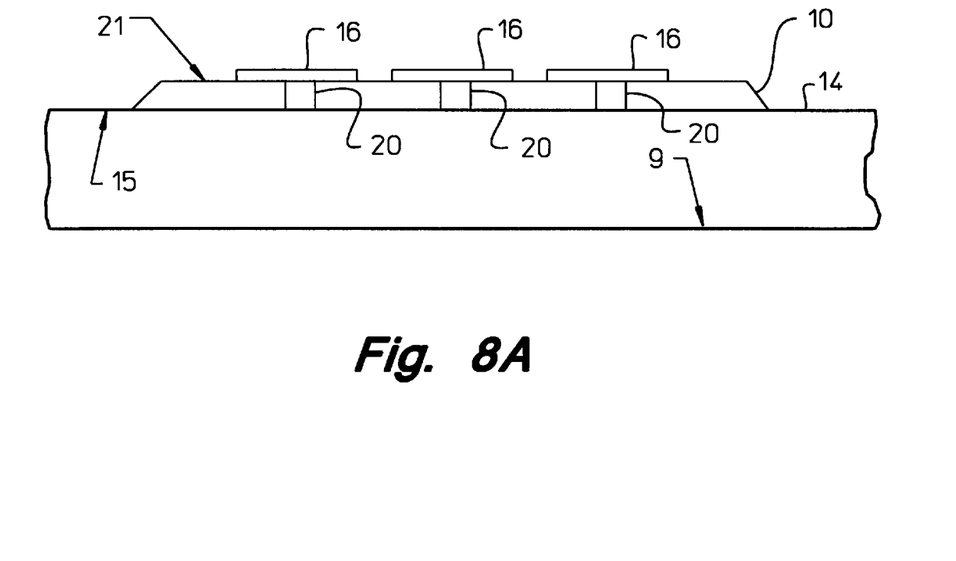
FIG. 8A is a cross sectional view of an alternate embodiment of a printed circuit board according to the invention.
Figure 8B:
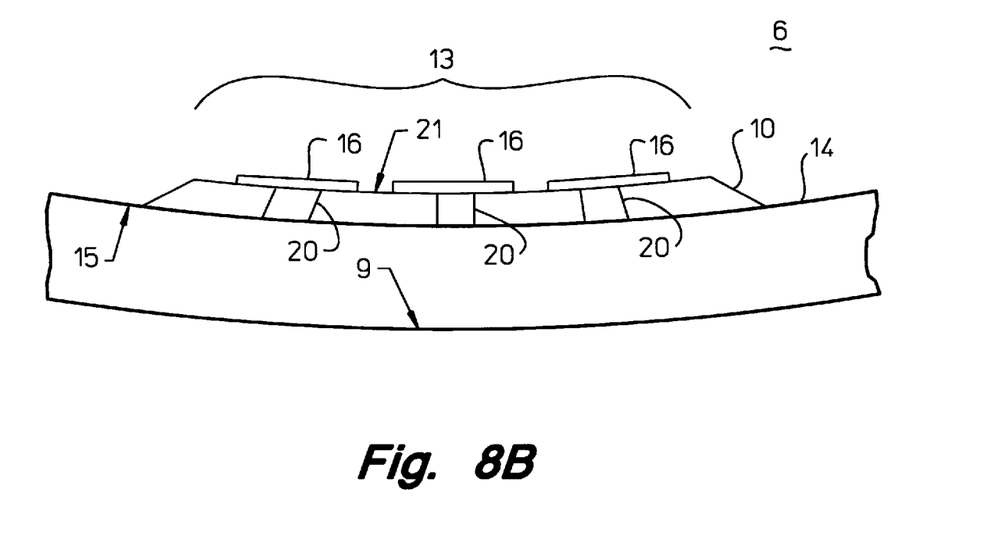
FIG. 8B is the same view as 8A, depicting the alternate embodiment of a printed circuit board after a change in temperature.

FIGS. 8A and 8B depict a second preferred embodiment of the PCB 6. In this embodiment the expansion layer 10 includes a working surface 21 that is substantially parallel to a major surface 15 of the substrate 14 to which the expansion layer is affixed. Two or more solder pads 16 are located on the working surface and are electrically connected to the substrate via electrically conductive pathways 20 extending from the first substrate into the expansion layer. In this embodiment it is preferred that the expansion layer have a CTE lower than the CTE of the substrate. Thus, the concavity 13 formed in the substrate opens towards the working surface.

Figure 9A:
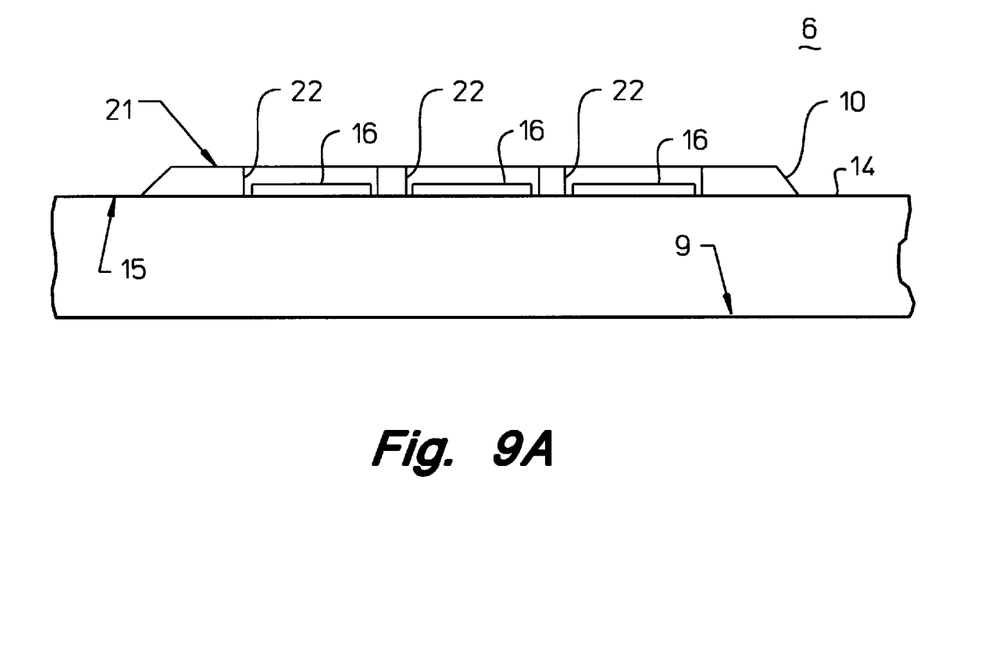
FIG. 9A is a cross sectional view of a second alternate embodiment of a printed circuit board according to the invention.
Figure 9B:
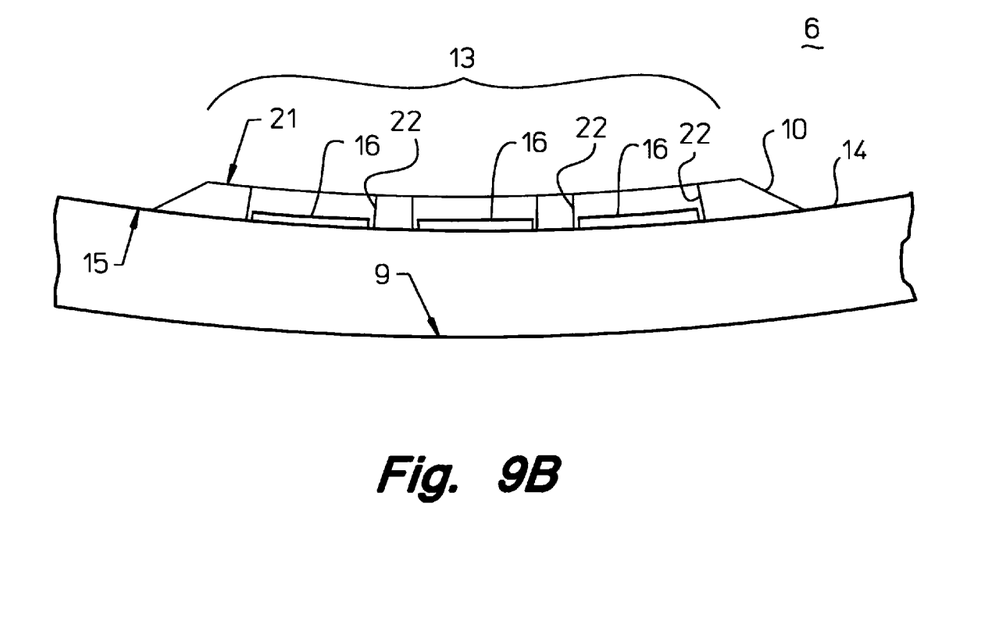
FIG. 9B is the same view as 9A, depicting the second alternate embodiment of a printed circuit board after a change in temperature.

FIGS. 9A and 9B depict a third preferred embodiment of the PCB 6. In this embodiment, both the solder pads 16 and the expansion layer 10 are located on a major surface 15 of the substrate 14. The expansion layer, however, additionally includes apertures 22 which pass through the expansion layer from the working surface 21 to the major surface 15 of the substrate. The apertures are also preferably in registry with the solder pads such that an electronic component can be electrically connected to the solder pads through the expansion layer. Alternatively, if a component were mounted on the opposite side 9 of the substrate, the solder pads 16 could be used as contacts for other components or as test probe contacts.

From the foregoing it will be appreciated that the PCB of the invention mitigates thermally-induced mechanical damage of solderjoints connecting the PCB to an electronic component by bending. The invention inexpensively increases the reliability of printed circuit assemblies and can be used in place of the more expensive and cumbersome apparatus currently used to reduce thernally-induced mechanical damage of solderjoints.

Although several specific embodiments of the invention have been described and illustrated, the invention is not to be limited to the specific forms or arrangements of parts so described and illustrated. The invention is limited only by the claims.

I claim:

1. A printed circuit assembly for mitigating thermal mechanical damage of solder joints, the assembly comprising:

a flexible printed circuit board having a first coefficient of thermal expansion;

a thermally expansive layer having a second coefficient of thermal expansion different than the first coefficient of thermal expansion, the thermally expansive layer affixed to the flexible printed circuit board such that a difference between the first coefficient of thermal expansion and the second coefficient of thermal expansion causes bending of the flexible printed circuit board as temperature changes; and an electronic component having a third coefficient of thermal expansion different from both the first coefficient of thermal expansion and the second coefficient of thermal expansion, the electronic component mounted in electrical contact with one of the major surfaces of the flexible printed circuit board by solder joints, in which the first coefficient of thermal expansion is greater than the third coefficient of thermal expansion and less than the second coefficient of thermal expansion, so that an increase in temperature causes the flexible printed circuit board to form a concavity, the concavity having an opening facing away from the thermally expansive layer and towards the electronic component.

2. A printed circuit assembly as in claim 1, in which the thermally expansive layer includes a high expansion polymer.

3. A printed circuit assembly as in claim 2, in which the high expansion polymer includes unreinforced epoxy.

4. A printed circuit assembly as in claim 2, in which the electronic component includes an area array package.

5. A printed circuit assembly for mitigating thermal mechanical damage of solder joints, the assembly comprising:

a flexible printed circuit board having a first coefficient of thermal expansion;

a thermally expansive layer having a second coefficient of thermal expansion different than the first coefficient of thermal expansion, the thermally expansive layer affixed to the flexible printed circuit board such that a difference between the first coefficient of thermal expansion and the second coefficient of thermal expansion causes bending of the flexible printed circuit board as temperature changes; and an electronic component having a third coefficient of thermal expansion different from both the first coefficient of thermal expansion and the second coefficient of thermal expansion, the electronic component mounted in electrical contact with one of the major surfaces of the flexible printed circuit board by solder joints, in which the second coefficient of thermal expansion is less than the first coefficient of thermal expansion and greater than the third coefficient of thermal expansion, so that an increase in temperature causes the flexible printed circuit board to form a concavity, the concavity having an opening facing towards the thermally expansive layer and towards the electronic component.

6. A printed circuit assembly for mitigating thermal mechanical damage of solder joints, the assembly comprising:

a flexible printed circuit board having a first coefficient of thermal expansion;

a thermally expansive layer having a second coefficient of thermal expansion different than the first coefficient of thermal expansion, the thermally expansive layer affixed to the flexible printed circuit board such that a difference between the first coefficient of thermal expansion and the second coefficient of thermal expansion causes bending of the flexible printed circuit board as temperature changes; and an electronic component having a third coefficient of thermal expansion different from both the first coefficient of thermal expansion and the second coefficient of thermal expansion, the electronic component mounted in electrical contact with one of the major surfaces of the flexible printed circuit board by solder joints, in which the second coefficient of thermal expansion is less than the third coefficient of thermal expansion and greater than the first coefficient of thermal expansion, so that an increase in temperature causes the flexible printed circuit board form a concavity, the concavity having an opening facing away from the thermally expansive layer and away from the electronic component.

7. A printed circuit assembly for mitigating thermal mechanical damage of solder joints, the assembly comprising:

a flexible printed circuit board having a first coefficient of thermal expansion;

a thermally expansive layer having a second coefficient of thermal expansion different than the first coefficient of thermal expansion, the thermally expansive layer affixed to the flexible printed circuit board such that a difference between the first coefficient of thermal expansion and the second coefficient of thermal expansion causes bending of the flexible printed circuit board as temperature changes; and an electronic component having a third coefficient of thermal expansion different from both the first coefficient of thermal expansion and the second coefficient of thermal expansion, the electronic component mounted in electrical contact with one of the major surfaces of the flexible printed circuit board by solder joints, in which the first coefficient of thermal expansion is less than the third coefficient of thermal expansion and greater than the second coefficient of thermal expansion, so that an increase in temperature causes the flexible printed circuit board form a concavity, the concavity having an opening facing towards the thermally expansive layer and away from the electronic component.

8. A printed circuit assembly for mitigating thermal mechanical damage of solder joints, the assembly comprising:

a flexible printed circuit board having a first coefficient of thermal expansion;

a thermally expansive layer having a second coefficient of thermal expansion different than the first coefficient of thermal expansion, the thermally expansive layer affixed to the flexible printed circuit board such that a difference between the first coefficient of thermal expansion and the second coefficient of thermal expansion causes bending of the flexible printed circuit board as temperature changes;

an electronic component having a third coefficient of thermal expansion different from both the first coefficient of thermal expansion and the second coefficient of thermal expansion, the electronic component mounted in electrical contact with one of the major surfaces of the flexible printed circuit board by solder joints; and a second thermally expansive layer having a fourth coefficient of thermal expansion different than the third coefficient of thermal expansion, the second thermally expansive layer affixed to a portion of the electronic component such that a difference between the fourth coefficient of thermal expansion and the third coefficient of thermal expansion causes bending of the electronic component as temperature changes.

9. A printed circuit board for mitigating thermal mechanical damage of solder joints electrically connecting an electronic component to the printed circuit board, the printed circuit board comprising:

a first substrate having:
two substantially parallel major surfaces, and
a first coefficient of thermal expansion;
solder pads located on one of the major surfaces; and
an expansion layer having a second coefficient of thermal expansion different than the first coefficient of thermal expansion, the expansion layer:
affixed to a portion of one of the major surfaces, and
arranged to provide a predetermined degree of bending for a given temperature change to a portion of the first substrate proximate to the expansion layer and proximate to two solder pads such that a concavity is formed in the portion of the substrate.

10. The printed circuit board of claim 9, in which the second coefficient of thermal expansion is greater than the first coefficient of thermal expansion.

11. The printed circuit board of claim 10, in which the expansive layer includes a high expansion polymer.

12. The printed circuit board of claim 11, in which the high expansion polymer includes unreinforced epoxy.

13. The printed circuit board of claim 9, further comprising:

a second substrate, the second substrate having two substantially parallel primary surfaces, one of the primary surfaces affixed to the expansion layer and arranged substantially parallel to the major surfaces.

14. The printed circuit board of claim 13, in which the second substrate is also affixed to the same major surface to which the expansion layer is affixed.

15. The printed circuit board of claim 9, in which the second coefficient of thermal expansion is less than the first coefficient of thermal expansion.

16. The printed circuit board of claim 9, in which the expansion layer includes apertures in registry with the solder pads.

17. The printed circuit board of claim 9, further comprising:

electrically conductive pathways extending from the first substrate into the expansion layer.

18. The printed circuit board of claim 17, in which the expansion layer includes:

a working surface substantially parallel to the two substantially parallel major surfaces; and two solder pads on the working surface, the two working surface solder pads in electrical contact with the pathways.

19. A printed circuit board for mitigating thermal mechanical damage of solder joints electrically connecting an electronic component to the printed circuit board, the printed circuit board comprising:

a substrate having:
two substantially parallel major surfaces, and
a first coefficient of thermal expansion;
an expansion layer having a second coefficient of thermal expansion different from the first coefficient of thermal expansion, and including a working surface substantially parallel to the major surfaces, the expansion layer is:
affixed to a portion of one of the major surfaces, and
arranged to provide a predetermined degree of bending for a given temperature change to the working surface such that a concavity is formed in the working surface; and
electrically conductive pathways extending from the working surface to the substrate, the pathways including solder pads, the solder pads located on the working surface proximate to the concavity.

* * * * *